United States Patent [19]

Bohr

[11] Patent Number: 5,536,675
[45] Date of Patent: Jul. 16, 1996

[54] ISOLATION STRUCTURE FORMATION FOR SEMICONDUCTOR CIRCUIT FABRICATION

[75] Inventor: Mark T. Bohr, Aloha, Oreg.

[73] Assignee: Intel Corporation, Santa Clara, Calif.

[21] Appl. No.: 512,078

[22] Filed: Aug. 7, 1995

Related U.S. Application Data

[63] Continuation of Ser. No. 176,092, Dec. 30, 1993, abandoned.

[51] Int. Cl.$^6$ .................................................. H01L 21/76
[52] U.S. Cl. ............................... 437/67; 437/63; 437/64; 148/DIG. 50
[58] Field of Search ................................. 437/67, 63, 69; 148/DIG. 50

[56] References Cited

U.S. PATENT DOCUMENTS

| | | | |
|---|---|---|---|
| 4,139,442 | 2/1979 | Bondur et al. | |
| 4,213,818 | 7/1980 | Lemons et al. | |
| 4,256,514 | 3/1981 | Pogge | |
| 4,551,911 | 11/1985 | Sasaki et al. | 148/DIG. 50 |
| 4,631,803 | 12/1986 | Hunter et al. | |
| 4,662,977 | 5/1987 | Motley et al. | |
| 4,666,556 | 5/1987 | Fulton et al. | |
| 4,853,344 | 8/1989 | Darmawan | |
| 4,876,214 | 10/1989 | Yamaguchi et al. | |
| 4,965,217 | 10/1990 | Desilets et al. | |
| 5,064,683 | 11/1991 | Poon et al. | 427/39 |
| 5,065,217 | 11/1991 | Verret | |
| 5,091,332 | 2/1992 | Bohr et al. | |
| 5,112,771 | 5/1992 | Ishii et al. | 437/67 |
| 5,118,384 | 6/1992 | Harmon et al. | |
| 5,342,480 | 8/1994 | Nishizama et al. | 437/67 |
| 5,358,891 | 10/1994 | Tsang, et al. | 437/67 |

FOREIGN PATENT DOCUMENTS

| | | | |
|---|---|---|---|
| 0134445 | 8/1983 | Japan | 437/67 |
| 0026240 | 2/1986 | Japan | 437/67 |
| 62-073737 | 4/1987 | Japan | |
| 0143835 | 6/1988 | Japan | 437/67 |
| 0232461 | 9/1988 | Japan | 437/67 |
| 63-305527 | 12/1988 | Japan | |
| 01-235245 | 9/1989 | Japan | |
| 0028330 | 1/1990 | Japan | 437/67 |
| 0283028 | 11/1990 | Japan | 437/67 |

OTHER PUBLICATIONS

"Method for Planarizing over Shallow Trenches Filled with Silicon Dioxide," *IBM Technical Disclosure Bulletin*, vol. 32, No. 9A, pp. 439–440 (Feb. 1990).

"Shallow Trench Formation Using Polysilicon Trench Refill," *IBM Technical Disclosure Bulletin*, vol. 33, No. 4, pp. 210–212 (Sep. 1990).

"Process for Simultaneously Forming Poly/Epi Silicon Filled Deep and Shallow Isolation Trenches Having a CVD Oxide Cap," *IBM Technical Disclosure Bulletin*, vol. 33, No. 7, pp. 388–392 (Dec. 1990).

"Self–Aligned Oxide–Filled Deep/Shallow Trench Isolation with One Fill/Planarization Step," *IBM Technical Disclosure Bulletin*, vol. 35, No. 4B, pp. 253–255 (Sep. 1992).

Davari, B., et al., "A New Planarization Technique, Using a Combination of RIE and Chemical Mechanical Polish (CMP)," *IEDM Technical Digest*, International Electron Devices Meeting, Washington, D.C., pp. 61–64 (Dec. 3–6, 1989).

Wolf, S., *Silicon Processing for the VLSI Era*, vol. 2: Process Integration, Lattice Press, pp. 12–83 (1990).

*Primary Examiner*—Trung Dang
*Attorney, Agent, or Firm*—Blakely, Sokoloff, Taylor & Zafman

[57] ABSTRACT

The deposition of oxide over a semiconductor substrate to fill trenches provides for simpler isolation processing for semiconductor circuit fabrication. Both shallow and deep trenches are etched in a semiconductor substrate for the formation of both device isolation structures and well isolation structures. Oxide is then deposited using chemical vapor deposition over the substrate, filling both the shallow and deep trenches. The resulting oxide layer over the substrate is then planarized, thus forming shallow and deep trench isolation structures in the substrate.

25 Claims, 4 Drawing Sheets

ISOLATION STRUCTURE FORMATION FOR SEMICONDUCTOR CIRCUIT FABRICATION

This is a continuation of application Ser. No. 09/176,092, filed Dec. 30, 1995 now abandoned.

BACKGROUND OF THE INVENTION

1. Field of the Invention

The present invention relates generally to the field of semiconductor circuit fabrication and more particularly to the field of isolation structure formation for semiconductor circuit fabrication.

2. Description of the Related Art

Various isolation structures are presently used in fabricating semiconductor circuits. For example, shallow isolation structures are used in order to isolate adjacent electronic devices such as transistors which are formed in fabricating certain semiconductor circuits such as NMOS or PMOS integrated circuits.

Typically, such shallow isolation structures are created using the well-known LOCal Oxidation of Silicon or LOCOS isolation technique. In the LOCOS process, a pad-oxide ($SiO_2$) layer is first grown on the surface of a semiconductor substrate while a silicon nitride ($Si_3N_4$) layer is then deposited over the pad-oxide layer. Using well-known methods, these layers are then patterned to define the width of the shallow recess to be etched in the substrate. Once the shallow recess has been etched, the substrate is subjected to an oxidation process where silicon dioxide ($SiO_2$) is grown in the recess; the silicon nitride layer which has not yet been removed prevents any oxide growth over the surface of the substrate. As a result, oxide grows to fill the entire recess including the opening in the patterned oxide and silicon nitride layers which defined the width of the shallow recess. A shallow isolation structure has thus been formed in the substrate.

Deep and narrow trench isolation structures have also been used in fabricating semiconductor circuits. These isolation structures are used, for example, to isolate n-wells and p-wells in CMOS circuits or to isolate transistors in Bipolar circuits. Furthermore, deep and narrow isolation structures prove to be very useful since they provide isolation while using only a limited substrate area. Deep trench isolation technology will thus prove to be extremely vital in fabricating future ultra large scale integrated (ULSI) circuits which will require high packing density of electronic devices.

In one prior art method of forming a deep and narrow trench isolation structure in a semiconductor substrate for bipolar transistors, a masking material is formed on the surface of the substrate. Typically, this masking material is formed by the growth of a thermal oxide ($SiO_2$) layer on the surface of the substrate, followed by the deposition of a CVD silicon nitride ($Si_3N_4$) layer and of a CVD oxide layer. The masking material is then patterned, as is known in the art, to define the width of the deep, narrow trench to be etched in the substrate. Once the deep, narrow trench has been etched in the substrate, a thin trench oxide layer is grown on the sidewalls and on the bottom of the trench. Polycrystalline silicon (polysilicon or poly-Si) is then deposited over the substrate to refill the trench. The polysilicon over the surface of the substrate is subsequently etched-back, causing the polysilicon refill in the trench to recess below the surface of the substrate. Finally, an oxide layer is grown over the polysilicon refill in the trench. Since the original thermal oxide and silicon nitride layers of the masking material have not yet been removed, oxide is prevented from growing over the surface of the substrate. As a result, the deep, narrow trench is completely refilled with polysilicon encapsulated in thermally grown oxide, thereby forming a deep trench isolation structure.

In fabricating some semiconductor circuits, for example, CMOS and BiCMOS circuits where both devices and wells are to be isolated, both shallow and deep isolation structures are formed to provide for device isolation on each well of the substrate and for well isolation in the substrate. In such instances, however, the formation of the shallow isolation regions in the substrate is performed independently of the formation of the deep isolation regions because, as may be seen from the above examples, deep trench isolation processing is more complicated than shallow isolation region processing. Deep trench isolation processing, for example, typically requires more steps than shallow isolation region processing and typically requires more difficult processing steps than those required for shallow isolation region processing.

Thus, what is needed is a simpler isolation process for forming deep trench isolation structures in a semiconductor substrate for semiconductor circuit fabrication. What is also needed is a simpler isolation process for forming both shallow and deep trench isolation structures in a semiconductor substrate for semiconductor circuit fabrication.

BRIEF SUMMARY OF THE INVENTION

The present invention advantageously simplifies prior art isolation processes for semiconductor circuit fabrication by reducing the number of process steps and/or simplifying the process steps required in forming isolation structures in a semiconductor substrate. More particularly, the present invention provides for simpler deep trench isolation processing for semiconductor circuit fabrication. The present invention also provides for simpler shallow and deep trench isolation processing for semiconductor circuit fabrication.

In accordance with the present invention, first and second portions of a trench are formed in a semiconductor substrate where the width of the first portion differs from the width of the second portion. Both portions of the trench are then filled with material to create an isolation structure in the semiconductor substrate. The material may include oxide. The material may also be deposited using chemical vapor deposition. Furthermore, an oxide layer may be grown in both portions of the trench prior to filling them with material. After the portions of the trench are filled, any resulting material on the surface of the substrate may be planarized.

Also in accordance with the present invention, a first trench and a second trench are formed in a semiconductor substrate where the depth of the second trench is greater than that of the first trench. In forming the first and second trenches, the first trench may be formed while a first portion of the second trench is formed; a second portion of the second trench may then be formed after the first portion of the second trench has been formed. The width of each trench at the surface of the substrate may differ or may be approximately the same. The second trench may be T-shaped. After they are formed, both trenches are simultaneously filled with material to form isolation structures. The material may include oxide. The material may also be deposited using chemical vapor deposition. Furthermore, an oxide layer may be grown in both trenches prior to filling them with material. After the trenches are filled, any resulting material on the surface of the substrate may be planarized.

The present invention thus advantageously simplifies the formation of isolation structures for semiconductor circuit fabrication. The processing steps required in deep trench isolation processing have been simplified. Furthermore, rather than forming shallow and deep isolation structures independently, the present invention integrates process steps required to form both shallow and deep trench isolation structures into one simplified isolation process.

While the above advantages of the present invention have been described, other attendant advantages, objects, and uses of the present invention will become evident to one of ordinary skill in the art based on the following detailed description with reference to the accompanying drawings.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A specific embodiment or embodiments in accordance with the present invention for simplified deep trench isolation processing for semiconductor circuit fabrication and for simplified shallow and deep trench isolation processing in semiconductor circuit fabrication is described. In the following description, numerous specific details are set forth such as specific thicknesses, materials, processing sequences, deposition methods, etc., in order to provide a thorough understanding of the present invention. It will be evident, however, to one of ordinary skill in the art that the present invention may be practiced without these specific details. In other instances, well-known processing steps, equipment, etc., have not been described in particular detail so that the present invention is not unnecessarily obscured.

Figure 1:
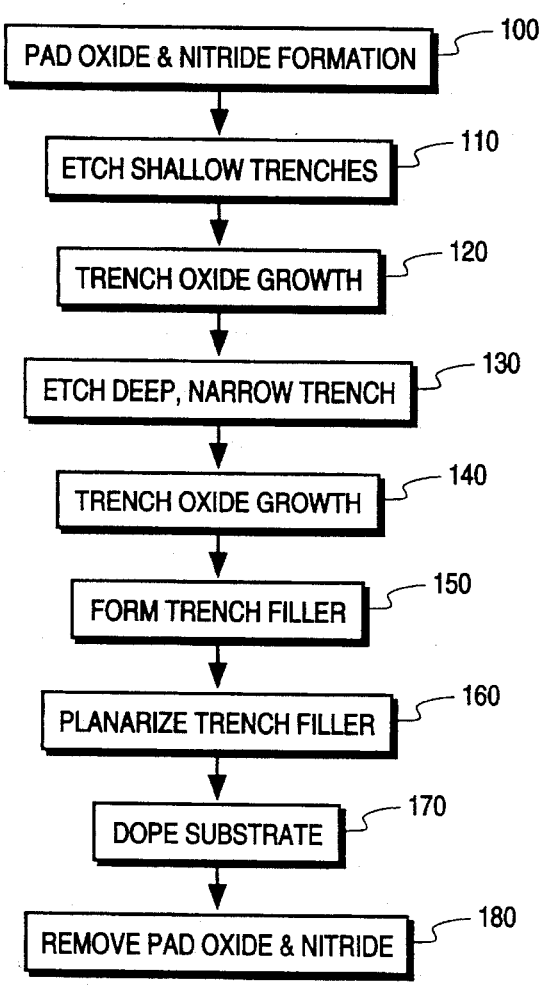
FIG. 1 illustrates, in the form of a flow diagram, a method of forming trench isolation structures in accordance with the present invention.

FIG. 1 illustrates, in the form of a flow diagram, a method of forming trench isolation structures for semiconductor circuit fabrication in accordance with the present invention. So as to better explain the specific embodiment or embodiments of the present invention, FIGS. 2 and 3a–3e will be described with reference to the steps in the method of FIG. 1.

Figure 2:
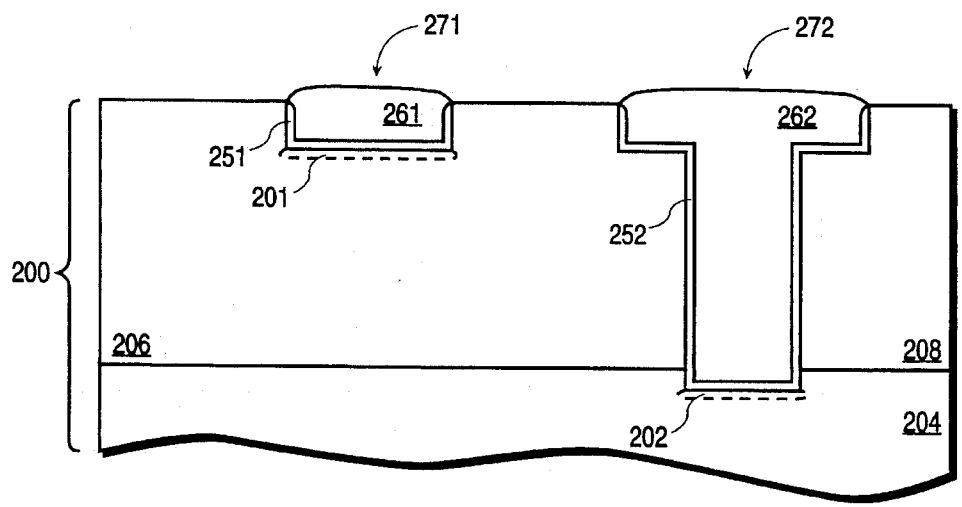
FIG. 2 illustrates a cross-sectional view of a portion of a semiconductor substrate having trench isolation structures formed in accordance with the present invention.

FIG. 2 illustrates a cross-sectional view of a portion of a semiconductor substrate 200 having trench isolation structures formed by the method of FIG. 1 in accordance with the present invention. In FIG. 2, a shallow trench isolation structure 271 and deep trench isolation structure 272 have been formed in semiconductor substrate 200. Semiconductor substrate 200 may be doped to provide for various regions, for example, $p^+$ region 204, n-well region 206, and p-well region 208, as is known in the art for fabricating various semiconductor circuits. Shallow trench isolation structure 271, which may provide device isolation on the surface of n-well region 206, has been filled with material 261, such as silicon dioxide ($SiO_2$), following the growth of an optional trench oxide layer 251. Optional channel stop implant region 201 may also be provided to increase the isolation qualities of shallow trench isolation structure 271.

Deep trench isolation structure 272 has also been filled with material 262, such as silicon dioxide, following the growth of optional trench oxide layer 252. Optional channel stop implant region 202 may also be provided to increase the isolation qualities of deep trench isolation structure 272. Deep trench isolation structure 272 may provide not only device isolation between a device on n-well region 206 and a device on p-well region 208 but also well isolation between n-well region 206 and p-well region 208 which are used, for example, in BiCMOS and CMOS integrated circuits. Deep trench isolation structure 272 provides adequate well isolation and prevents "latchup" without requiring excessive substrate area; it is therefore extremely useful for future ultra large-scale integrated (ULSI) circuits which will require high packing densities. Deep trench isolation structure 272 may also be used for isolation in Bipolar integrated circuits.

Figure 3A:
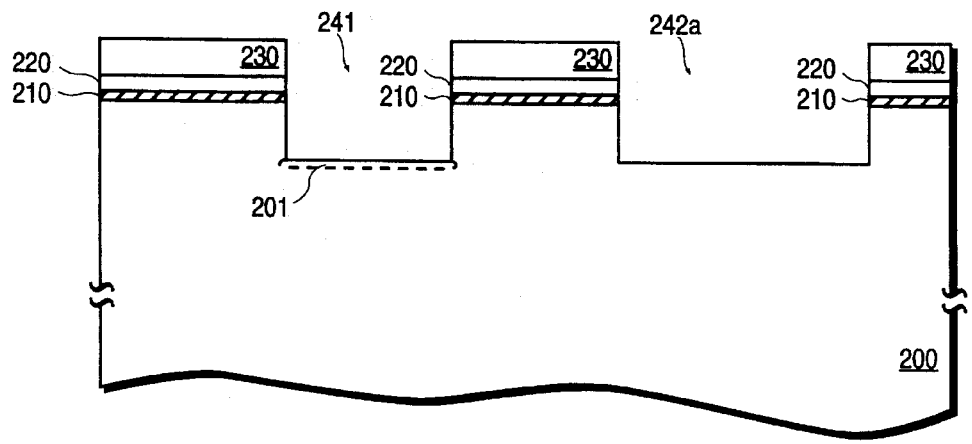
FIG. 3a illustrates a cross-sectional view of a portion of a semiconductor substrate where shallow regions are etched in accordance with the present invention.

For the isolation structure formation illustrated in FIG. 2, semiconductor substrate 200 as illustrated in FIG. 3a is provided. Preferably substrate 200 is a silicon substrate, yet it is to be appreciated that a variety of different types of silicon substrates, or even other types of semiconductor substrates, may be used in practicing the present invention. Clearly the type of substrate 200 used depends upon one's specific circuit requirements for the semiconductor circuit to be formed. Furthermore, while the description of the method used in fabricating the semiconductor circuit of FIG. 2 is described in the context of forming only a single deep trench isolation structure and a single shallow trench isolation structure in substrate 200, it is to be understood that this description is merely illustrative for a clearer understanding of the present invention. It is to be understood that the views of FIGS. 2 and 3a–3e are merely partial views of a larger semiconductor substrate and that other isolation structures may be formed on this same substrate. It is also to be understood that the present invention may be practiced in forming these other isolation structures and may also be practiced in forming only some of the isolation structures to be formed on substrate 200. For example, the present invention may be practiced to form only deep trench isolation structures, such as structure 272 of FIG. 2, on substrate 200 while other isolation structures may be formed on substrate 200 using other isolation processing techniques. Preferably, though, the present invention is used to form both shallow trench isolation structures, such as structure 271 of FIG. 2, and deep trench isolation structures, such as structure 272 of FIG. 2, on substrate 200.

In Step 100 of the method illustrated in FIG. 1, a pad oxide ($SiO_2$) layer 210 and a silicon nitride ($Si_3N_4$) layer 220 are formed on the surface of substrate 200 as illustrated in FIG. 3a. Pad oxide layer 210 is optional and provides a "pad" or "buffer" to cushion the transition of stress between substrate 200 and silicon nitride layer 220. While in a preferred embodiment approximately 10 nm of pad oxide is thermally grown on the surface of substrate 200, other pad oxide thicknesses may be used here. Pad oxide layer 210 may alternatively be deposited over substrate 200. Approximately 150 nm of silicon nitride is then deposited over pad oxide layer 210 using chemical vapor deposition (CVD) to form silicon nitride layer 220. Other silicon nitride thicknesses and other techniques may be used in forming silicon nitride layer 220.

Once pad oxide layer 210 and silicon nitride layer 220 have been formed, trenches 241 and 242a as illustrated in FIG. 3a are formed in substrate 200 in Step 110 of FIG. 1. Here, substrate 200 is covered with a photoresist layer 230, which is then masked, exposed, and developed to define openings in photoresist layer 230 where trenches 241 and 242a are to be formed in substrate 200. Next, silicon nitride layer 220 and oxide layer 210 are etched in the defined trench areas. Trenches 241 and 242a may then be anisotropically etched in substrate 200 using a plasma etch with a chemistry including HBr and $NF_3$. It is to be understood, though, that other etch techniques, such as one with a chemistry including $SiF_4$, may be used to etch trenches 241 and 242a. Furthermore, silicon nitride layer 220, oxide layer 210, and trenches 241 and 242a may all be etched using the same etch technique. It is to be appreciated trenches 241 and 242a may be formed with sloped sidewalls, if desired, in order to improve sidewall coverage during trench refill. Vertical walls are preferred, however, in order to increase circuit packing density.

The desired width and depth of trenches 241 and 242a may vary depending, for example, on the design and isolation requirements of the circuit to be fabricated. While in a preferred embodiment trench 241 is approximately 0.4 microns in width and approximately 0.4 microns in depth whereas trench 242a is approximately 1.0 microns in width and approximately 0.4 microns in depth, trenches 241 and 242a may be formed having other widths or depths. It is also to be appreciated that the width of shallow trench 241 may be either less than or greater than the width of trench 242a and that, alternatively, the widths of shallow trench 241 and trench 242a may be approximately equal. While the widths of trenches 241 and 242a need to be large enough to provide adequate isolation between devices to be formed on the surface of substrate 200, the smallest widths allowable for such isolation are preferred to increase circuit packing density. In this connection, however, the desired widths of trenches 241 and 242a may be limited by the lithographic resolution capabilities used in defining trenches 241 and 242a.

Once trenches 241 and 242a have been etched, an optional channel-stop implant 201 may be made at this time to improve the isolation qualities of the shallow trench isolation structure to be formed using trench 241. Photoresist layer 230 is later removed following the formation of trenches 241 and 242a; pad oxide layer 210 and silicon nitride layer 220, however, are not yet removed at this time.

Figure 3B:
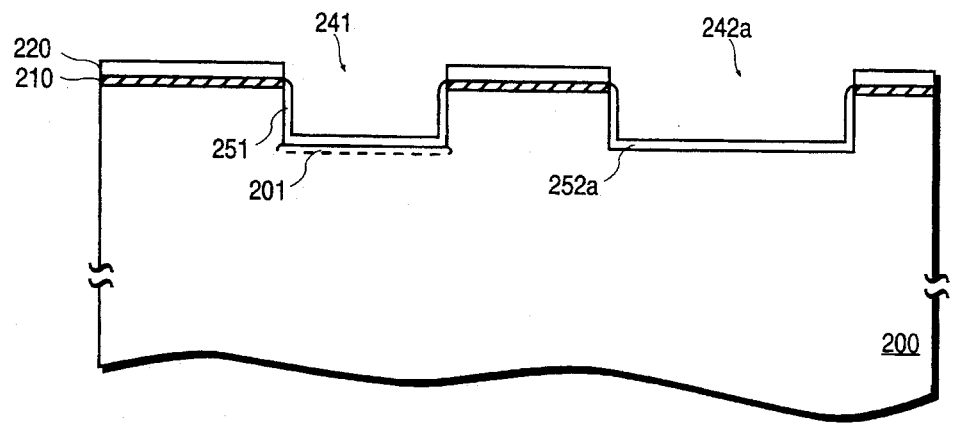
FIG. 3b illustrates the formation of trench oxide in the semiconductor substrate of FIG. 3a in accordance with the present invention.

After trenches 241 and 242a have been etched, a trench oxide layer 251 and 252a as illustrated in FIG. 3b is formed in each trench 241 and 242a, respectively, in Step 120 of FIG. 1. While in a preferred embodiment approximately 5 nm of oxide is thermally grown in each trench 241 and 242a to form trench oxide layers 251 and 252a, other oxide thicknesses may be grown in each trench 241 and 242a here. Trench oxide layers 251 and 252a are optional, yet they are preferably formed to passivate the interior walls and bottom of each trench 241 and 242a which may have been slightly damaged during the trench etch.

Figure 3C:
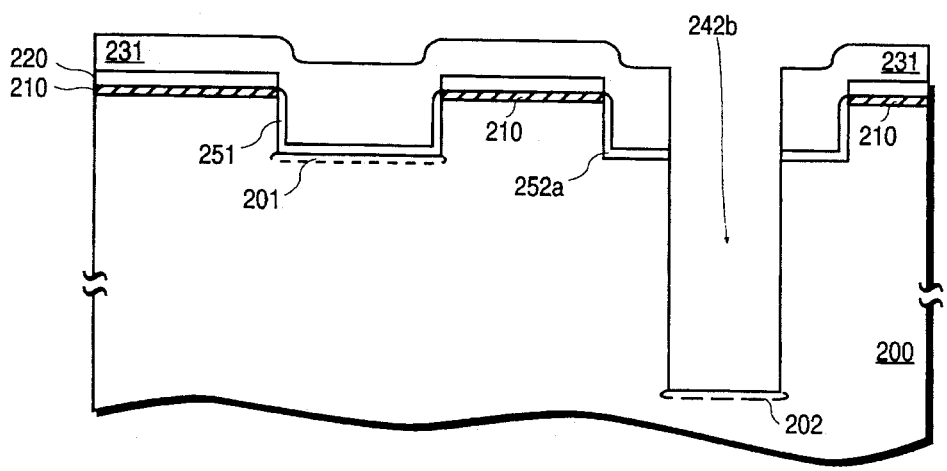
FIG. 3c illustrates the etching of a deep, narrow region in the semiconductor substrate of FIG. 3b in accordance with the present invention.

In Step 130 of FIG. 1, then, trench 242b as illustrated in FIG. 3c is formed in substrate 200. Here, substrate 200 is covered with a photoresist layer 231, which is then masked, exposed, and developed to define an opening in photoresist layer 231 where trench 242b is to be formed in substrate 200. It is to be appreciated trench 242b is to be formed in substrate 200 at the bottom of shallow trench 242a. Next, the trench oxide in the defined trench area is etched. Trench 242b is then anisotropically etched in substrate 200 using a plasma etch with a chemistry including HBr and $NF_3$. It is to be understood, though, that other etch techniques, such as one with a chemistry including $SiF_4$, may be used to etch trench 242b. Furthermore, it is to be appreciated trench 242b may be formed with sloped sidewalls, if desired, in order to improve sidewall coverage during trench refill. Vertical walls are preferred, however, in order to increase circuit packing density.

The desired width and depth of trench 242b will vary depending, for example, on the design and isolation requirements of the circuit to be fabricated. While in a preferred embodiment trench 242b is approximately 0.5 microns in width and approximately 1.0 microns in depth as measured from the bottom of trench 242a, trench 242b may be formed having other widths or depths. Trench 242b only needs to be wide enough and deep enough to provide adequate isolation. Preferably, in order to provide adequate isolation in CMOS circuits, for example, the depth of trench 242b is deeper than the depth at which subsequent p-wells and n-wells are to be formed.

Once trench 242b has been etched, an optional channel-stop implant 202 may be made at this time to improve the isolation qualities of the deep trench isolation structure to be formed using trench 242b. Photoresist layer 231 is later removed following the formation of trench 242b; pad oxide layer 210 and silicon nitride layer 220, however, are not yet removed at this time.

Figure 3D:
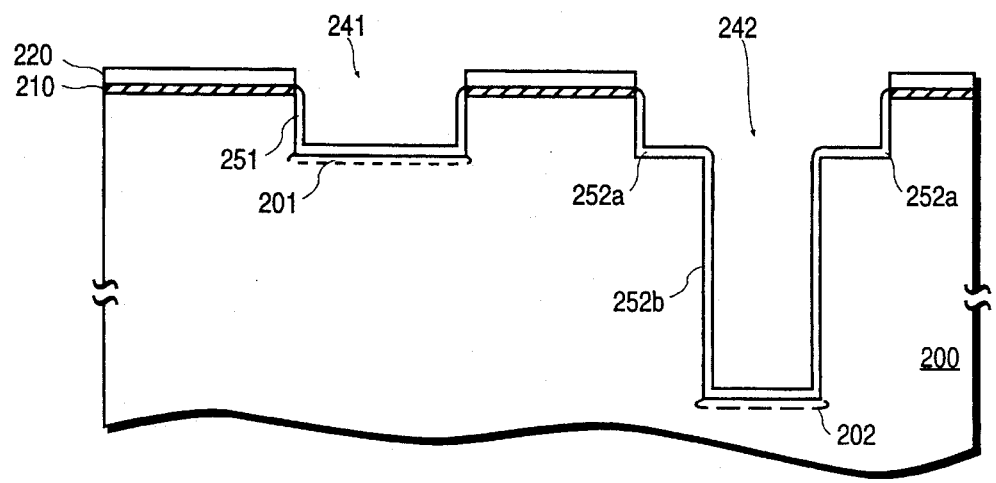
FIG. 3d illustrates the formation of trench oxide in the semiconductor substrate of FIG. 3c in accordance with the present invention.

After trench 242b has been etched, trench oxide layer 252b as illustrated in FIG. 3d is formed in trench 242b in Step 140 of FIG. 1. While in a preferred embodiment approximately 5 nm of oxide is thermally grown in trench 242b to form trench oxide layer 252b, other oxide thicknesses may be grown here. Trench oxide layer 252b is optional, yet it is preferably formed to passivate the interior walls and bottom of trench 242b which may have been slightly damaged during the trench etch.

As illustrated in FIG. 3d, two trenches 241 and 242 have now been formed to form both shallow and deep trench isolation structures. Shallow trench 241 has been formed simultaneously with the formation of the upper, shallow and wider portion (trench 242a) of trench 242. This was followed by the formation of the deep, narrow portion (trench 242b) of trench 242 so that a T-shaped deep trench isolation structure may be formed. Although a preferred method of forming both shallow trench 241 and deep trench 242 has been described above, it is to be appreciated that the above steps may be reordered, modified, or even improved upon and that other processing steps may be used so long as the end result is the formation of shallow trench 241 and deep trench 242 as illustrated in FIG. 3d. For example, the deep, narrow portion (trench 242b) of trench 242 may be etched prior to the simultaneous etch of shallow trench 241 and of the upper, shallow and wide portion (trench 242a) of trench 242. In this etch sequence, though, photoresist may be deposited in deep, narrow trench 242b when defining trenches 241 and 242a. Accordingly, it is preferable to form trenches 241 and 242a prior to forming trench 242b so as to avoid having to remove this photoresist from deep, narrow trench 242b. Alternatively, shallow trench 241 may be etched independently of the portions (trenches 242a and 242b) of trench 242. Furthermore, various other techniques and/or various other materials may be used for the masking and etching of trenches 241 and 242 in substrate 200.

It is also to be appreciated that while trench 242 is described as being T-shaped, trench 242 may be a simple deep, narrow trench which does not have an upper, shallow and wide portion. Here, shallow trench 242a is not formed at all; only a deep, narrow trench, similar to trench 242b, is formed in substrate 200 either prior to or after the formation of shallow trench 241. Regardless of the method used to etch trenches 241 and 242 and regardless of the size and shape of trenches 241 and 242, though, the trench oxide layers may all be optionally grown after both trenches 241 and 242 have been fully etched.

Figure 3E:
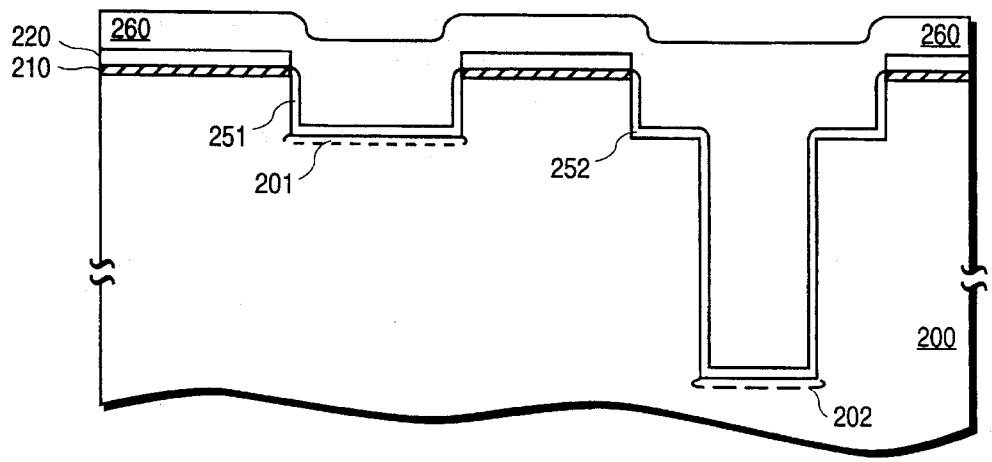
FIG. 3e illustrates the formation of material over the semiconductor substrate of FIG. 3d to fill trenches in accordance with the present invention.

Once trenches 241 and 242 have been formed as illustrated in FIG. 3d, filler material 260 is formed over substrate 200 in Step 150 of FIG. 1 to refill both shallow trench 241 and deep trench 242 simultaneously as illustrated in FIG. 3e. Filler material 260 formed over substrate 200 only needs to be thick enough to fill both shallow trench 241 and deep trench 242. In a preferred embodiment approximately 0.6 microns of silicon dioxide ($SiO_2$) is CVD deposited over substrate 200 using a chemistry including $SiH_4$. It is to be understood, though, that other thicknesses of oxide and/or other oxide formation techniques, for example CVD with a tetraethylorthosilicate- or TEOS-based chemistry, may be used here. Preferably, the oxide deposition over substrate 200 is conformal and fills both shallow trench 241 and deep trench 242 with minimal or no voids. It is also to be understood that other filler materials and techniques may be used here to simultaneously refill trenches 241 and 242. For example, a spin-on glass or alternatively a combination of CVD oxide followed by a spin-on glass may be used here. Other materials such as silicon nitride ($Si_3N_4$) may also be used to refill trenches 241 and 242.

Following the deposition of filler material 260, it is planarized in Step 160 of FIG. 1 so as to form both shallow trench isolation structure 271, which is filled with material 261, and deep trench isolation structures 272, which is filled with material 262, as illustrated in FIG. 2. In a preferred embodiment where filler material 260 is oxide, a chemical mechanical polish (CMP) is used to etch-back oxide layer 260. Here, a polish slurry with a chemistry including KOH and silica is used while oxide layer 260 is being polished by a polishing pad. Silicon nitride layer 220 which remains beneath oxide layer 260 serves as a polish-stop layer. It is to be understood, though, that other polishing or etch techniques may be used here to remove filler material 260 from the surface of substrate 200 and may depend on the filler material actually used to refill trenches 241 and 242.

Following the removal of filler material 260, semiconductor substrate 200 is doped in Step 170 of FIG. 1 to provide various regions, for example, $p^+$ region 204, n-well region 206, and p-well region 208 as illustrated in FIG. 2, as is known in the art for fabricating various semiconductor circuits. Lastly, silicon nitride layer 220 and oxide layer 210 are removed in Step 180 of FIG. 1. While in a preferred embodiment the doping of substrate 200 is performed after the planarization of filler material 260, it is to be appreciated that substrate 200 may be appropriately doped at other times in the fabrication process. For example, substrate 200 may be doped to provide regions 204, 206, and 208 before photoresist layer 231 of FIG. 3c has been patterned or, alternatively, after silicon nitride layer 220 and oxide layer 210 are removed. Furthermore, it is to be understood that substrate 200 is to be doped in accordance with the specific functional and design requirements for the circuit being manufactured.

A shallow trench isolation structure 271 and deep trench isolation structure 272 as illustrated in FIG. 2 have thus been formed in accordance with the present invention. Both structures 271 and 272 have planar surfaces which may be slightly raised over the surface of substrate 200 as filler material may remain in the openings of nitride layer 220 and oxide layer 210 after the polish. It is to be appreciated that the planar surface topography of each trench isolation structure aids in the fabrication of subsequent layers of a multilevel integrated circuit. Since surface topography affects the accuracy of lithography definition, it is also to be appreciated that the resulting planar surface topography of trench isolation structures will prove to be valuable in fabricating future, high density, ultra large scale integrated (ULSI) circuits.

A simplified process in forming trench isolation structures has thus been described. The processing steps required in deep trench isolation processing have been simplified as compared to prior art deep trench isolation processes. For example, the polysilicon deposition and etch-back steps used in the prior art are no longer needed. Furthermore, rather than forming shallow and deep trench isolation structures independently, the process steps required to form both shallow and deep trench isolation structures have been integrated into one simplified isolation process.

Once the trench isolation structures have been formed in substrate 200 using the present invention, active devices such as Bipolar and MOS transistors may now be formed in each well of substrate 200. The active devices may then be interconnected together to form functional Bipolar, BiCMOS, and CMOS integrated circuits such as memories and microprocessors.

While the specific embodiment or embodiments of the present invention have been described above with regard to the best mode and preferred embodiment or embodiments contemplated by the inventor, it is to be appreciated that the present invention is not limited to the above embodiment or embodiments and that various modifications may be made to the above embodiment or embodiments without departing from the broader spirit or scope of the present invention as defined in the following claims. The specific embodiment or embodiments are, accordingly, to be regarded in an illustrative rather than a restrictive sense.

What is claimed is:

1. A method for forming a trench isolation structure in a semiconductor substrate, comprising the steps of:

(a) forming in said semiconductor substrate a first portion of a trench having a first width;

(b) applying a photoresist layer to said semiconductor substrate;

(c) masking said photoresist layer to define a region for a second portion of said trench within said first portion, said second portion having a second width less than said first width;

(d) forming in said region said second portion of said trench deeper than said first portion; and (e) after forming said first and second portions of said trench, filling both said first portion and said second portion of said trench with material in a single processing step.

2. The method of claim 1, further comprising the step of growing an oxide layer in said trench prior to said filling step (e).

3. The method of claim 1, wherein said material comprises an oxide and wherein said filling step comprises the step of depositing said material over said semiconductor substrate using chemical vapor deposition to fill said trench with said material.

4. A method for forming isolation structures in a semiconductor substrate comprising the steps of:
   (a) forming a first trench and a first portion of a second trench in said semiconductor substrate, said first trench and said first portion of said second trench having a first depth;
   (b) applying a photoresist layer to said semiconductor substrate;
   (c) masking said photoresist layer to define a region for a second portion of said second trench within said first portion while protecting said first portion and said first trench;
   (d) forming a second portion of said second trench in said region, said second trench having a second depth greater than said first depth; and
   (e) simultaneously filling said first trench and said second trench with material.

5. The method of claim 4, further comprising the step of growing an oxide layer in said first trench and in said second trench prior to said filling step (e).

6. The method of claim 4, wherein said second trench is a T-shaped trench.

7. The method of claim 4, wherein said semiconductor substrate has a surface, wherein said first trench has a first width at the surface of said semiconductor substrate, and wherein said second trench has a second width at the surface of said semiconductor substrate which is greater than or less than said first width.

8. The method of claim 4, wherein said semiconductor substrate has a surface, wherein said first trench has a first width at the surface of said semiconductor substrate, and wherein said second trench has a second width at the surface of said semiconductor substrate which is approximately equal to said first width.

9. The method of claim 4, wherein said material comprises an oxide and wherein said filling step comprises the step of depositing said oxide over said semiconductor substrate using chemical vapor deposition to simultaneously fill said first trench and said second trench with said oxide.

10. The method of claim 4, wherein said forming steps (a) and (b) comprise the steps of:
    forming said first trench while simultaneously forming a first portion of said second trench in said semiconductor substrate; and
    forming a second portion of said second trench after said first portion of said second trench has been formed.

11. The method of claim 4, wherein said step of forming said first trench and said step of forming said second trench comprise the steps of:
    forming a first portion of said second trench in said semiconductor substrate; and
    after said first portion of said second trench has been formed, forming said first trench while simultaneously forming a second portion of said second trench in said semiconductor substrate.

12. The method of claim 1, comprising the steps of:
    forming a first layer over the semiconductor substrate prior to the forming step (a);
    patterning the first layer prior to the filling step (e) to form a patterned first layer; and
    polishing over said semiconductor substrate to planarize said material after the filling step (e) using the patterned first layer as a polish stop.

13. The method of claim 12, wherein the patterned first layer comprises silicon nitride.

14. The method of claim 12, wherein the forming step (a) and the step of patterning the first layer comprise the steps of:
    (i) forming an imaging layer over the first layer,
    (ii) patterning the imaging layer to form a patterned imaging layer,
    (iii) etching the first layer in accordance with the patterned imaging layer to form the patterned first layer, and
    (iv) etching the semiconductor substrate to form the first portion of the trench.

15. The method of claim 4, comprising the steps of:
    forming a first layer over the semiconductor substrate prior to the forming step (a);
    patterning the first layer prior to the filling step (e) to form a patterned first layer; and
    polishing over said semiconductor substrate to planarize said material after the filling step (e) using the patterned first layer as a polish stop.

16. The method of claim 15, wherein the patterned first layer comprises silicon nitride.

17. The method of claim 15, wherein the forming step (a) and the step of patterning the first layer comprise the steps of:
    (i) forming an imaging layer over the first layer,
    (ii) patterning the imaging layer to form a patterned imaging layer,
    (iii) etching the first layer in accordance with the patterned imaging layer to form the patterned first layer, and
    (iv) etching the semiconductor substrate to form the first trench.

18. A method for forming isolation structures in a semiconductor substrate comprising the steps of:
    (a) forming over the semiconductor substrate a first layer having a first material;
    patterning the first layer to form a patterned first layer having at least a first opening for a first trench and a second opening for a second trench;
    (c) forming in the semiconductor substrate said first trench having a first depth while simultaneously forming in the semiconductor substrate an upper portion of said second trench;
    (d) applying a photoresist layer to said semiconductor substrate;
    (e) masking said photoresist layer to define a region for a lower portion of said second trench within said upper portion;
    (f) forming in said region said lower portion of the second trench, the second trench having a second depth greater than the first depth;
    (g) forming over the semiconductor substrate a second layer having a second material to simultaneously fill the first trench and the second trench with the second material; and
    (h) polishing the second layer using the patterned first layer as a polish stop to form the isolation structures.

19. The method of claim 18, further comprising the step of growing an oxide layer in the first trench and in the second trench prior to the forming step (g).

20. The method of claim 18, wherein the semiconductor substrate has a surface, wherein the first trench has a first width at the surface of the semiconductor substrate, and wherein the second trench has a second width at the surface of the semiconductor substrate which is greater than or less than the first width.

21. The method of claim 18, wherein the semiconductor substrate has a surface, wherein the first trench has a first width at the surface of the semiconductor substrate, and wherein the second trench has a second width at the surface of the semiconductor substrate which is approximately equal to the first width.

22. The method of claim 18, wherein the second material comprises an oxide and wherein the forming step (g) comprises the step of depositing the oxide over the semiconductor substrate using chemical vapor deposition to simultaneously fill the first trench and the second trench with the oxide.

23. The method of claim 18, wherein the forming step (c) is performed prior to the forming step (f).

24. The method of claim 18, wherein the first material comprises silicon nitride.

25. The method of claim 18, wherein the patterning step (b) and the forming step (c) comprise the steps of:

(i) forming an imaging layer over the first layer, (ii) patterning the imaging layer to form a patterned imaging layer, (iii) etching the first layer in accordance with the patterned imaging layer to form the first patterned layer, and (iv) etching the semiconductor substrate to form the first trench and to form the upper portion of the second trench.

* * * * *

UNITED STATES PATENT AND TRADEMARK OFFICE
CERTIFICATE OF CORRECTION

PATENT NO. : 5,536,675
DATED : July 16, 1996
INVENTOR(S) : Mark T. Bohr

It is certified that error appears in the above-identified patent and that said Letters Patent is hereby corrected as shown below:

In column 10 at line 46 insert --(b)-- prior to "patterning"

Signed and Sealed this

Twenty-ninth Day of April, 1997

Attest:

BRUCE LEHMAN

Attesting Officer

Commissioner of Patents and Trademarks